(12) United States Patent
Wang et al.

(10) Patent No.: US 7,848,107 B2
(45) Date of Patent: Dec. 7, 2010

(54) HEATSINK MOUNTING SYSTEM

(75) Inventors: Fang Wang, San Ramon, CA (US);
Thierry Sin Yan Too, San Ramon, CA (US); Jim Moore, Los Gatos, CA (US);
Mong Hu, San Jose, CA (US)

(73) Assignee: Intricast Company, Inc., Santa Clara, CA (US)

( * ) Notice: Subject to any disclaimer, the term of this patent is extended or adjusted under 35 U.S.C. 154(b) by 71 days.

(21) Appl. No.: 12/342,273

(22) Filed: Dec. 23, 2008

(65) Prior Publication Data

US 2010/0157539 A1  Jun. 24, 2010

(51) Int. Cl.
*H05K 7/20* (2006.01)
(52) U.S. Cl. .................. 361/704; 361/710; 361/719; 165/121; 165/185; 257/719
(58) Field of Classification Search ............ 361/679.54, 361/697, 704, 709, 710, 715, 719
See application file for complete search history.

(56) References Cited

U.S. PATENT DOCUMENTS

| | | | |
|---|---|---|---|
| 5,307,239 A | | 4/1994 | McCarty et al. |
| 5,495,392 A | * | 2/1996 | Shen ..................... 361/697 |
| 5,579,205 A | | 11/1996 | Tustaniwsky |
| 5,603,374 A | | 2/1997 | Wu |
| 5,677,829 A | * | 10/1997 | Clemens ................. 361/697 |
| 5,898,571 A | | 4/1999 | Mertol |
| 5,932,925 A | | 8/1999 | McIntyre |
| 6,153,932 A | | 11/2000 | Liang |
| 6,311,766 B1 | * | 11/2001 | Lin et al. .................. 165/80.3 |
| 6,401,807 B1 | * | 6/2002 | Wyler et al. ............... 165/121 |
| 6,476,484 B1 | | 11/2002 | Liang |
| 6,644,396 B2 | | 11/2003 | Liang |
| 6,707,672 B2 | * | 3/2004 | Liu ........................... 361/704 |
| 6,707,674 B1 | * | 3/2004 | Bryant et al. ............. 361/704 |
| 7,567,435 B2 | | 7/2009 | Azar et al. |
| 7,619,892 B2 | * | 11/2009 | Liang ....................... 361/707 |
| 7,697,299 B2 | * | 4/2010 | Desrosiers et al. ......... 361/719 |

(Continued)

OTHER PUBLICATIONS

European Search Report mailed Jun. 4, 2010 for corresponding EPO case 09178738.2, citing the US patents and publications identified about (publication 1 has matured into patent 1). No Specific portions of the cited references were identified in the report.

*Primary Examiner*—Boris L Chervinsky
*Assistant Examiner*—Courtney Smith
(74) *Attorney, Agent, or Firm*—Michael J. Hughes

(57) ABSTRACT

A heatsink system (10) is provided for containing and engaging a heatsink (16) against a heat generating component, typically an IC chip (18). The system (10) includes a rectangular integrally formed resilient frame (12) defining a cavity (26) in which the heatsink (16) is contained. The frame (12) includes a pair of opposed lateral sides (30) and a pair of opposing gripping sides (28) with L-shaped corner blocks (32) depending from the intersections thereof. The gripping sides (28) include centrally positioned grip handles (38) extending upward and grip blocks (34) depending therefrom, each grip block (34) having a grip tongue (36) at the lower extent thereof extending inward into the cavity (26). Inward pressure on the grip handles (38) forces the grip tongues (36) outward to release objects captured thereby.

12 Claims, 3 Drawing Sheets

U.S. PATENT DOCUMENTS

2001/0028552 A1   10/2001  Letourneau
2003/0011995 A1    1/2003  Liang
2003/0103332 A1*   6/2003  Sopko et al. ................ 361/704
2006/0198107 A1    9/2006  Azar
2009/0040729 A1*   2/2009  Deng et al. ................ 361/710

* cited by examiner

HEATSINK MOUNTING SYSTEM

This is a non-provisional patent application.

TECHNICAL FIELD

The present invention relates generally to semiconductor cooling methods and more specifically to a releasable mounting system for mounting heatsink elements onto semiconductor chips in planar substrates.

BACKGROUND ART

Many electronic components such as IC chips require cooling structures such as heatsinks to conduct and radiate heat away from the electronic components. The heatsink components, which come in a wide variety of forms, must be held against the surface of the chips in order to function effectively. However, it is often desirable to mount the heatsink in a removable manner. Consequently, a need exists to provide economical, simple and stable systems for mounting the heatsinks on the chips and boards.

An example of a stable and adjustable heatsink mount is found in U.S. Pat. No. 5,932,925 to Gerald McIntyre, assigned to Intricast, Inc. of Santa Clara Calif. This patent shows a novel method of providing a resilient adjustable pressure to the heatsink in order to maintain it in abutment against the semiconductor such that maximum conductive heat transfer may occur.

There remains a need for heatsink mounting systems for electronic components which are readily attachable and detachable, while maintaining good heat transfer capabilities. Accordingly, there is a need in the industry for a system such as the present invention.

DISCLOSURE OF INVENTION

Accordingly, it is an object of the present invention to provide a system for mounting a heatsink device on a semiconductor chip or chip board which is easily attached and removed.

Another object of the invention of the present invention is to provide a heatsink mount which provides resilient pressure on the heatsink in order to maintain conductive contact with the electronic component.

A further object of the present invention is to provide a heatsink mount which may, with many heatsink devices, be mounted in two orientations.

Yet another object of the invention is to provide a heatsink mounting system which does not require any modifications to the circuit board upon which the chip is secured.

Still another object of the invention is to provide a heatsink mount which frames the chip/circuit board at all four corners to maintain stable centering and contact.

Briefly, one preferred embodiment of the present invention is a heatsink mount adapted to releasably secure a heatsink to the surface of a generally rectangular electronic component. The mount system includes a resilient open frame having opposed lateral sides and gripping sides, with each corner apex being provided with L-shaped corner retaining blocks for positioning the heatsink. The lateral sides have buttressed vertical cavities at their midpoints for receiving the ends of a spring strip which extends across the heatsink and provides resilient downward pressure thereon. The gripping sides have grip blocks depending therefrom to extend below the edges of the chip/board, with each grip block including a grip tongue for extending beneath the edge of the chip/board to secure the mount and heatsink thereto. Each gripping side further includes a grip handle such that the opposed grip handles may be squeezed together to torque the resilient frame and cause the grip tongues to spread apart, thus allowing installation on or removal of the mounting system from the chip/board.

An alternate embodiment provides tension-adjusting screws within the buttresses such that the tension of the spring strip may be varied as desired to increase or decrease the pressure on the heatsink.

An advantage of the present invention is that the heatsink mount may be easily installed and removed without the use of special tools.

Another advantage of the present invention is that no modification to the chip or chip carrier is ordinarily needed to facilitate mounting and in particular that no additional holes need be provided on the circuit board.

A further advantage of the present invention is that the heatsink is laterally positioned by the retaining corner blocks.

Still another advantage of the present invention is that it does not extend laterally beyond the edges of the chip by a significant amount, thus allowing closer packing of chips on a board.

Yet another advantage of the present invention is that the securing provided by the grip tongues does not work loose during ordinary usage.

A further advantage of the present invention is that the use of a metal spring element provides greater durability and consistency during use since the metal deforms less with heat and retains resiliency better than plastics.

These and other objects and advantages of the present invention will become clear to those skilled in the art in view of the description of the best presently known modes of carrying out the invention and the industrial applicability of the preferred embodiments as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

Figure 1:
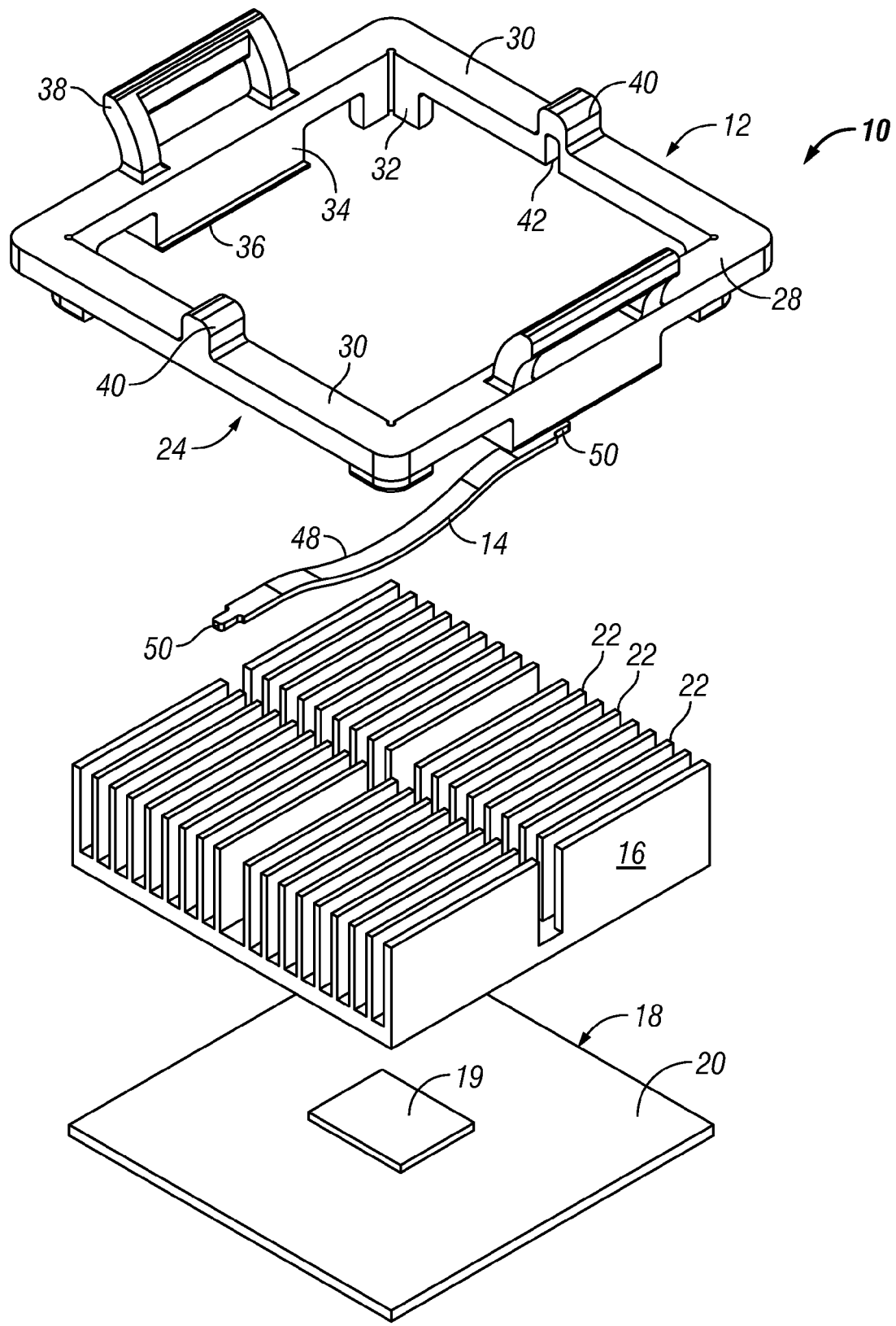
FIG. 1 is an exploded perspective view of the present invention, including illustration of a semiconductor chip and a typical heatsink used therewith.

A preferred embodiment of the present invention is a heatsink mounting system shown in an exploded perspective view in FIG. 1 and referred to herein by the general reference character 10. The mounting system 10 is illustrated in the various figures of the drawing and is described below in reference to such figures. The mounting system 10 is in the form of a unitary clip member 12 and a separate spring member 14. In use, the clip member 12 and spring member 14 operate to releasably secure a typical heatsink 16 against a typical IC chip member 18 (such as a CPU) in order to facilitate conductive dissipation of thermal energy from the IC chip 18 into the heatsink 16. The typical IC chip 18 illustrated includes a die portion 19 and a substrate portion 20, with the entire chip 18 being typically mounted on a circuit board (not shown) including numerous other components. The heatsink 16 (a conventional object not an integral part of the invention) is provided with fins 22 which allow the excess thermal energy to dissipate into the environment by radiation and convection.

Figure 2:
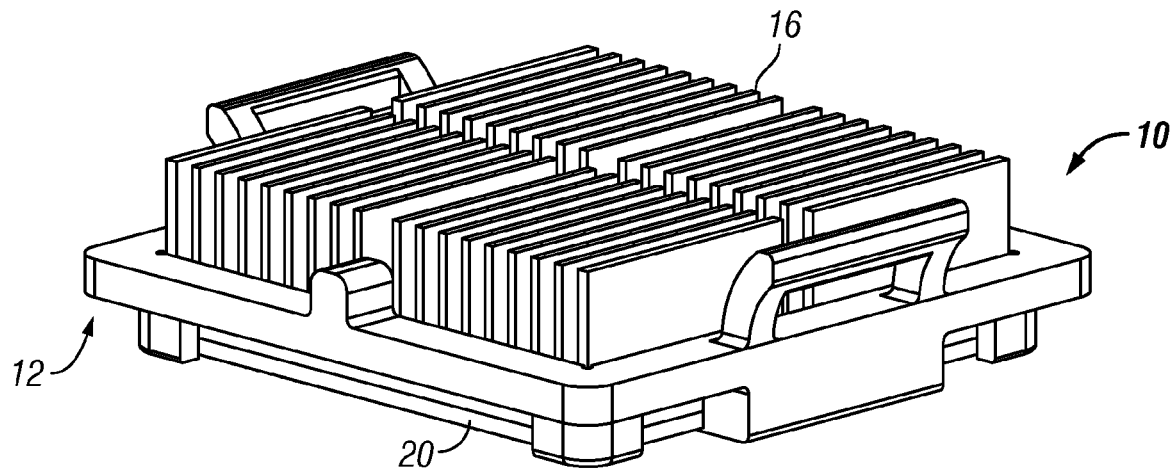
FIG. 2 is a perspective view of the heatsink mounting system of the present invention, shown with a heatsink therewithin.
Figure 3:
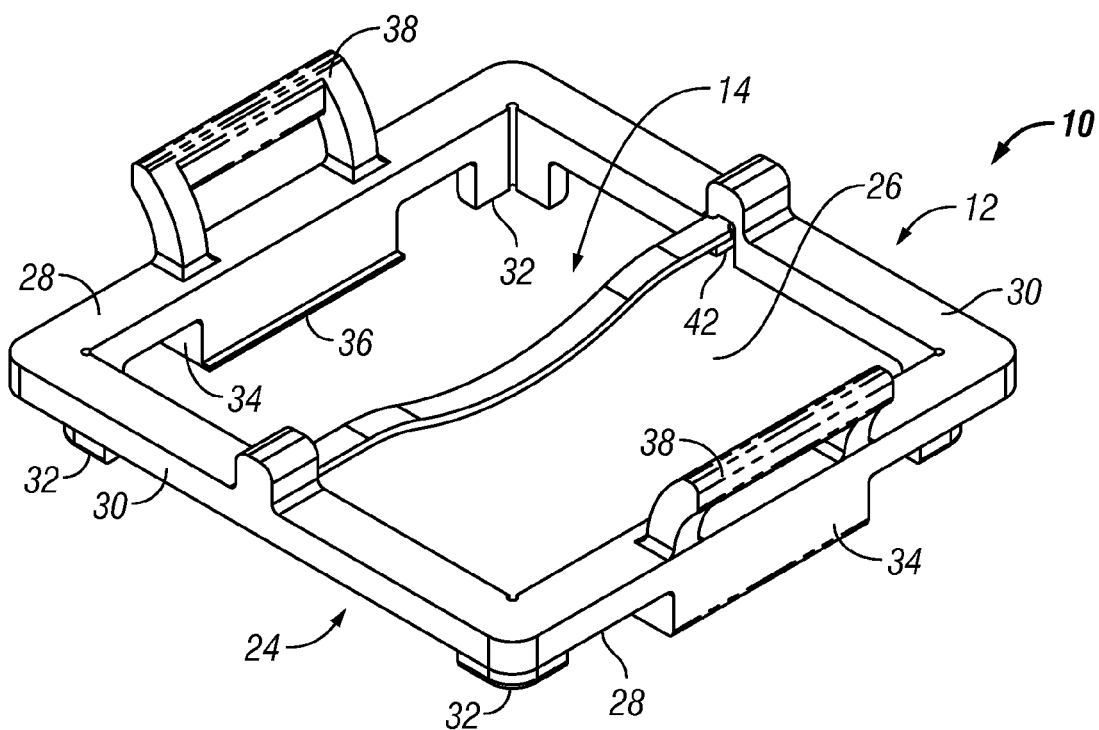
FIG. 3 is a further perspective view showing only the inventive components of the heatsink mounting system.
Figure 4:
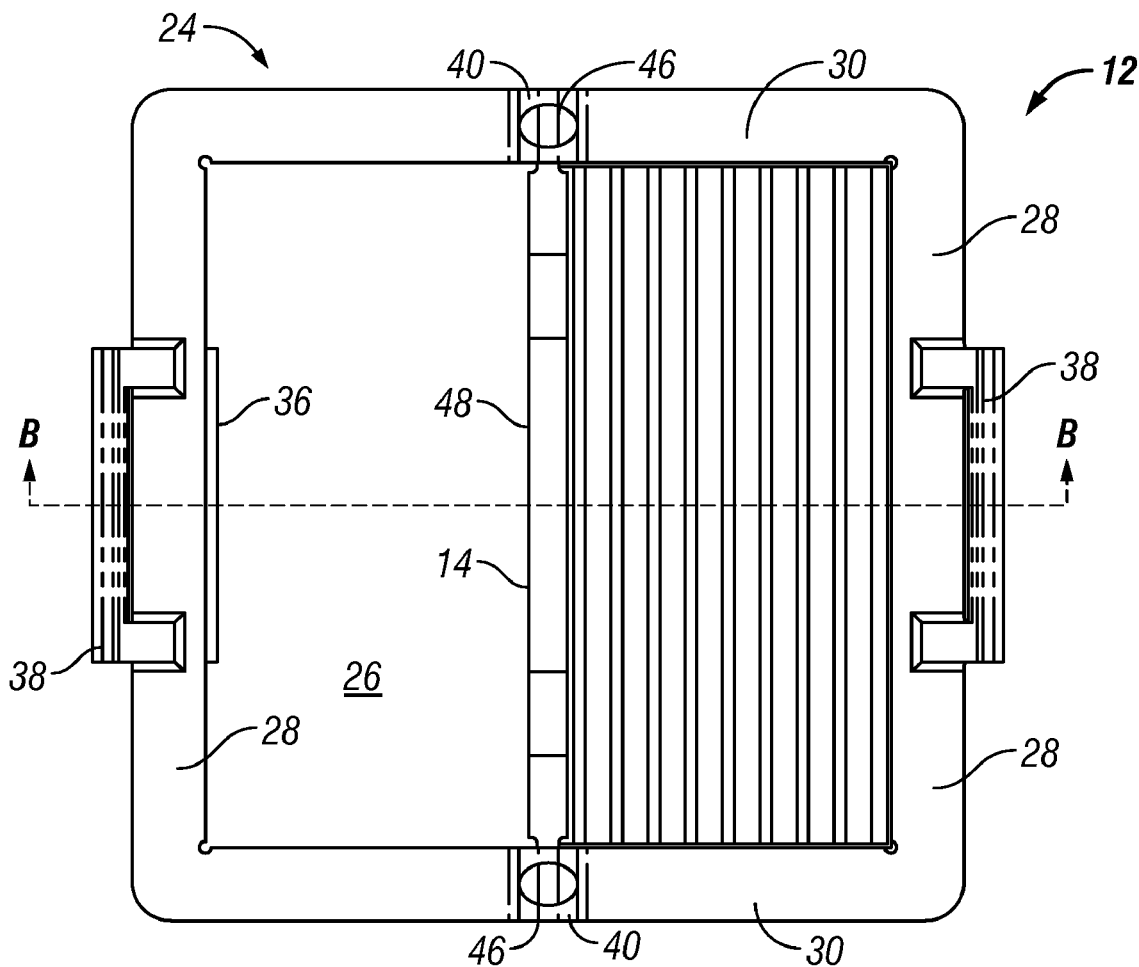
FIG. 4 is a top plan view of the heat sink mounting system, showing a heatsink mounted in one-half of the system only for illustration purposes and also illustrating an alternate embodiment.
Figure 5:
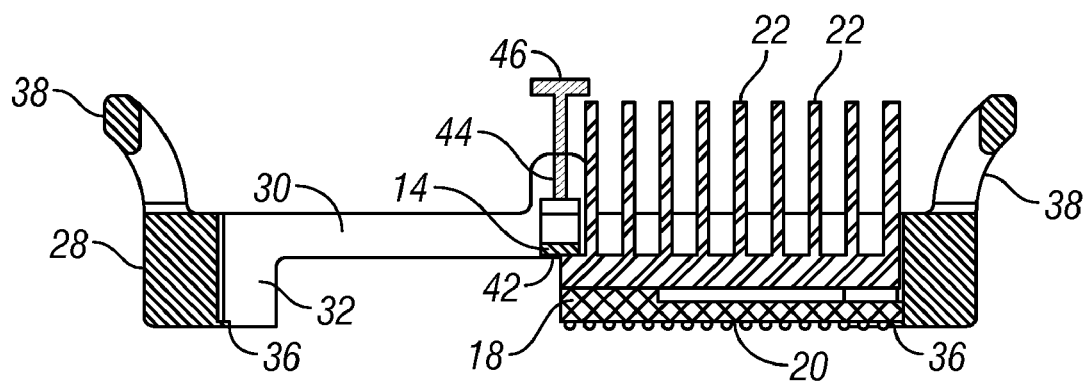
FIG. 5 is a cross-sectional view, taken along line B-B of FIG. 4.

The fully assembled system 10, including the heatsink 16 and chip 18, is shown in FIG. 2 while just the system 10 components (the clip member 12 and the spring member 14) are illustrated in assembled mode in FIG. 3. FIGS. 4 and 5 show the system 10 with the additional elements present on one side of the illustration while they are absent on the other half, as is particularly notable in the cross-sectional view of FIG. 5.

The clip member 12 is preferably an integrally molded component including a number of distinct elements. The clip member 12 is bilaterally symmetrical about a central axis (represented by the bisecting line B-B of FIG. 4 which defines the cross-sectional view of FIG. 5). The clip member 12 may be seen as being a circumferential resilient frame 24 which defines a center cavity 26 in which the IC chip 18 and heatsink 16 are mounted. The resilient frame includes a pair of opposing gripping sides 28 and a pair of opposing lateral sides 30. Corner blocks 32 depend in an "L" shape from the intersections of each pair of sides to define corner positioning retention for the rectangular (square in the preferred embodiment shown) circuit board chip carrier 20.

Grip blocks 34 depend from the center portions of each of the gripping sides 28, extending downward to the same extent as the corner blocks 32. The bottom extent of each grip block 34 which faces the central cavity 26 is also provided with a grip tongue or ledge 36 for engaging the underside of the substrate 20. Grip handles 38 extend upward and curve outward from the upper surfaces of the gripping sides 28, directly above the grip blocks 34. This curvature prevents the heatsink 16 from interfering with the handles 38 when compressed. Inward pressure on both grip handles 38 causes torsion in the gripping sides 28 which results in the grip blocks 34 being forced apart, so that the grip tongues 36 spread enough to release the bottom surface of the substrate 20. This facilitates installation and removal of the clip member 12.

In the centers of the lateral sides 30, vertical buttresses 40 are provided, each defining a vertical receiving channel 42; open to the bottom. The vertical receiving channels 42 are adapted to receive and constrain the ends of the spring member 14. Alternate methods of receiving the ends of the spring member 14 are also envisioned, including multiple apertures or through holes at different heights. In the preferred embodiment 10, the receiving channels 42 are of a fixed depth selected for optimal downward pressure on the spring member 14. However, as illustrated in FIGS. 4 and 5, an alternate embodiment envisions threaded apertures 44 in the vertical buttresses 40 for receiving adjusting screws 46. The adjusting screws 46 may be rotated to adjust the downward pressure on the spring member 14 in order to optimize the contact of the heatsink 16 with the upper surface of the IC chip 18. Another potential adjustment mechanism (not shown) is to provide sliding receptors in the channels 42 which may be fixed at different heights.

The spring member 14 is preferably a metal spring strip or wire including a bowed center expanse 48 and a pair of narrower end tips 50. The center expanse 48 is bowed downward to exert resilient pressure upon the heatsink 16. The end tips 50 engage the upper ends of the vertical channels 42 to hold the spring member 14 in position. The spring member 14 is removable and replaceable with interchangeable similarly shaped springs of different tension, for optimizing the amount of pressure applied.

The inventive heatsink mounting system 10 may be constructed in varying shapes and with dimensions to match particular types of chip carriers and heatsinks. The square arrangement illustrated is typical of common configurations.

The usually preferred material for forming the clip member 12 of the heatsink mounting system 10 is a resilient heat-resistant plastic such as nylon, PVC, PTFE and fiber glass, although rubber compositions may also work. The spring member 14 is typically a preformed metal strip spring, but may also be formed of metal wire, with the particular metal of alloy selected to provide the desired resiliency. However, other suitable materials, having appropriate properties and structural integrity, may be substituted.

While various embodiments have been described above, it should be understood that these have been presented by way of example only, and not as providing any limitation on the invention.

INDUSTRIAL APPLICABILITY

The heatsink mounting system 10 of the present invention is adapted for use in holding heatsink components 16 in good conductive contact with electronic components such as IC chips 18. The capacity to easily install and remove the installation, the security of the mounting and the ability to modify the spring pressure are all advantages which make the inventive mounting system 10 desirable.

A typical usage will be in electronic systems where an IC chip or other component generates excess heat during use, which heat must be dissipated for better performance and to avoid degradation. The IC chip 18, usually in the form of a die portion 19 contained in an integral substrate 20, will be secured in position within an enclosed space. The die 19 provides a planar conductive surface presented for abutment against the base portion of a heatsink 16.

The typical heatsink 16 will have a flat planar base portion for fitting conductively against the IC chip 18 and a plurality of extending fins 22 to dissipate the heat. At least one bisecting cross channel will be provided on the upper surface of the heatsink 16, and in some cases a second bisecting cross channel (as shown in the drawings) is also provided so that the fins 22 may be arrayed in two perpendicular configurations. When the assembly is configured for use the heatsink 16 is physically placed on the IC chip 18 and against the die portion 19 and centered on the substrate 20.

The mounting system 10 is then brought into play to secure the heatsink 16 in position. The spring member 14 is placed with the end posts 50 extending into the vertical receiving channels 42 and with the bowed center expanse 48 arcing downward to engage the heatsink 16. The clip member 12/spring member 14 combination is then lowered over the heatsink 16 such that the spring member 14 extends within a bisecting cross channel. As the degree of engagement increases the grip handles 38 are compressed inward (typically with a thumb and finger) to twist the gripping sides 28 such that the grip tongues 36 are forced apart (like jaws) far enough to slip past the edges of the substrate 20. When full engagement is achieved, the grip handles 38 are released and the grip tongues 36 close underneath the edges of the substrate 20 to secure the assembly together. The spring member 14 exerts constant downward pressure on the heatsink 16 to maintain optimal contact with the IC chip 18 and efficient heat dissipation. When it is desired to disassemble the combination, similar pressure on the grip handles 38 opens the jaws so that the tongues 36 release the substrate 20 and the mounting system 10 can be removed.

It is also possible to mount the heatsink 16 within the mounting system 10 before applying the entire combination to the chip 18. In such a case the grip tongues support the heatsink 16 until full assembly is achieved and the grip handles 38 would not be compressed until the combination is essentially in place, to avoid premature release of the heatsink 16.

The system 10 may be mounted in either orientation if the selected heatsink 16 has perpendicular cross channels. The L-shaped corner blocks 32 enclose the corresponding corners of the heatsink base and thus prevent any lateral shifting during usage. If the optional tightening subsystem is in place, the tension on the spring member 14 may be adjusted to increase or decrease the pressure. This may be accomplished by turning the adjusting screws 46 within the threaded apertures 44 to vary downward force on the spring end tips 50, thereby modifying the pressure exerted by the center expanse 48. Each of these aspects increases convenience and makes the system 10 have benefits to the typical user.

The mounting system 10 is adaptable in that it may be manufactured to custom sizes and shapes to accommodate different types of heatsinks 16. The dimensions and resilience can also be varied during manufacture to alter the strength of the jaws and the force of grip provided. Varying spring members 14 may be interchanged to modify the pressure applied to the heatsink 16. All of these features make the system adaptable to a multitude of uses.

For the above, and other, reasons, it is expected that the heatsink mounting system of the present invention will have widespread industrial applicability. Therefore, it is expected that the commercial utility of the present invention will be extensive and long lasting.

This correspondence chart is provided for ease of understanding informational purposes only, and does not constitute a part if the formal patent application.

| Ref Num | Description | Group |
|---|---|---|
| 10 | Heatsink Mounting System | |
| 12 | Clip Member (C) | |
| 14 | Spring Member (S) | |
| 16 | Heatsink | |
| 18 | IC Chip | |
| 19 | Chip Die | |
| 20 | Chip Substrate | |
| 22 | Fins | C |
| 24 | Resilient Frame | C |
| 26 | Center Cavity | C |
| 28 | Gripping Sides | C |
| 30 | Lateral Sides | C |
| 32 | Corner Blocks | C |
| 34 | Grip Blocks | C |
| 36 | Grip Tongues | C |
| 38 | Grip Handles | C |
| 40 | Buttresses | C |
| 42 | Vertical Channels | |
| 44 | Threaded Aperture | |
| 46 | Adjusting Screw | |
| 48 | Center Expanse | |
| 50 | End Tips | |

We claim:

1. A heatsink mounting system for holding a heatsink against a heat generating component, comprising:
    a resilient rectangular frame member, including a pair of opposing gripping sides and a pair of opposing lateral sides, said lateral sides each including a receiving channel; and
    a spring member having end tips for engaging said opposing receiving channels, said spring member engaging an upper surface of the heatsink to hold it in position against the heat generating component;
    wherein applying pressure against said gripping sides forces said frame member to torsion such that jaws open to capture objects such as the heatsink or the heat generating component when said pressure is released and said jaws close, and spring pressure adjusting means are provided in said receiving channels to adjust the pressure on said spring end tips and consequently against said heatsink.

2. The heatsink mounting system of claim 1, wherein said gripping sides are provided with grip handles extending therefrom to provide pressure levers for applying said pressure.

3. The heatsink mounting system of claim 1, wherein said gripping sides each include a grip block depending therefrom, each said grip block having a grip tongue projecting therefrom.

4. The heatsink mounting system of claim 2, wherein said gripping sides each include a grip block depending therefrom, each said grip block having a grip tongue projecting therefrom.

5. The heatsink mounting system of claim 1, wherein said spring member includes a bowed central expanse which arcs in the direction of the heatsink.

6. An assembly for mounting and securing a heatsink against a heat generating component, comprising:
    a resilient frame defining a rectangular interior cavity, said frame including a pair of opposing gripping sides and opposing lateral sides, each said gripping side including a grip handle extending therefrom, a grip block depending therefrom, said grip block having a grip tongue extending into said cavity and each lateral side including at least one receiving channel; and
    a spring member engagable at each end thereof with a corresponding one of said receiving channels for applying pressure to a heatsink contained within said cavity; wherein
    applying pressure toward said cavity on each said grip handle causes said frame to twist such that said grip blocks are forced apart from said cavity and said grip tongues are forced beyond the extent of said cavity and
    an L-shaped corner block is provided depending from and below each intersection of one of said gripping sides and one of said lateral sides, said corner blocks framing and positioning said heatsink within said interior cavity.

7. The assembly of claim 6, wherein:
    said heatsink is adapted to be placed against an IC chip including a rigid generally planar substrate; and
    said grip tongues extend a short distance inward from said grip blocks, said distance being sufficient to capture said heat sink and said substrate.

8. The assembly of claim 6, wherein:
    said spring member includes an end tip at each end for fitting into said corresponding receiving channel,
    said receiving channels have a depth selected such that a desirable constant pressure is provided to said heatsink by said spring member.

9. The assembly of claim 8, wherein:
tension adjusting means are provided to provide pressure to each said end tip.

10. The assembly of claim 8, wherein:
adjusting screws are provided in said receiving channels for adjusting the pressure upon each said spring tip.

11. The assembly of claim 6, wherein:
said grip handles curve outwardly away from said center cavity.

12. A heatsink mounting system for releasably mounting a heatsink on an IC chip having a generally planar substrate, comprising
a clip member; and
a spring member adapted to mate with said clip member; wherein
said clip member includes a resilient frame defining a rectangular interior cavity, said frame including a pair of opposing gripping sides and opposing lateral sides, each said gripping side including a grip handle extending therefrom, a grip block depending therefrom, said grip block having a grip tongue extending into said cavity and each lateral side including at least one receiving channel;
said spring member includes an end tip at each end for fitting into said corresponding receiving channel, and
tension adjusting means are provided to provide pressure to each said end tip, and
said clip member is adapted to capture the IC chip by releasably gripping under opposing edges of said substrate and to simultaneously force said spring member against the heatsink to maintain contact pressure against the IC chip.

\* \* \* \* \*